(12) United States Patent
Cecchi

(10) Patent No.: US 7,348,793 B2
(45) Date of Patent: Mar. 25, 2008

(54) METHOD AND APPARATUS FOR DETECTION AND PREVENTION OF BULK CMOS LATCHUP

(75) Inventor: Delbert R. Cecchi, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 186 days.

(21) Appl. No.: 11/335,766

(22) Filed: Jan. 19, 2006

(65) Prior Publication Data

US 2007/0164774 A1    Jul. 19, 2007

(51) Int. Cl.
*G01R 31/26*     (2006.01)
(52) U.S. Cl. .................................................. 324/769
(58) Field of Classification Search ............ 324/765, 324/769, 158.1; 257/368, 296, 371–374, 257/288, 355, 369; 365/226; 340/649, 652; 438/220, 227
See application file for complete search history.

(56) References Cited

U.S. PATENT DOCUMENTS

| | | | |
|---|---|---|---|
| 4,594,633 A | | 6/1986 | Townsend et al. |
| 5,159,518 A | * | 10/1992 | Roy .............................. 361/56 |
| 5,212,616 A | * | 5/1993 | Dhong et al. .................. 361/18 |
| 5,909,181 A | * | 6/1999 | Golzmane .................... 340/649 |
| 6,064,555 A | | 5/2000 | Czajkowski et al. |

* cited by examiner

*Primary Examiner*—Ha Tran Nguyen
*Assistant Examiner*—Tung X. Nguyen
(74) *Attorney, Agent, or Firm*—Joan Pennington

(57) ABSTRACT

A method and apparatus are provided for detection and prevention of bulk complementary metal oxide semiconductor (CMOS) latchup. A separate power distribution is provided for coupling a positive voltage supply rail to the N well and a ground voltage supply rail to the P well of the CMOS circuit. At least one sensor monitors current flow in a bias voltage applied to at least one of an N well and a P well of the CMOS circuitry. A latchup event is detected responsive to a predefined increase in the monitored current flow. A switch temporarily interrupts the connection of at least one of the N well and the P well to the respective voltage supply rail when the latchup event is detected.

6 Claims, 6 Drawing Sheets

PRIOR ART

PRIOR ART

METHOD AND APPARATUS FOR DETECTION AND PREVENTION OF BULK CMOS LATCHUP

FIELD OF THE INVENTION

The present invention relates generally to the field of semiconductor manufacturing, and more particularly, relates to a method and apparatus for detection and prevention of bulk complementary metal oxide semiconductor (CMOS) latchup.

DESCRIPTION OF THE RELATED ART

Latchup is a significant problem in complementary metal oxide semiconductor (CMOS) bulk integrated circuits. In the internal area of conventional CMOS logic chips latchup typically is not a problem because there is no source of current to trigger the latchup. However, in space applications the current can be provided by the impact of a charged particle.

Conventional CMOS circuits are susceptible to latchup, for example, in space applications due to the presence of parasitic bipolar transistors in their construction.

FIG. 1 illustrates a conventional latchup structure including parasitic bipolar transistors as shown for example that result when a CMOS inverter stage is formed by a P-channel field effect transistor (PFET) and an N-channel field effect transistor (NFET). The parasitic bipolar transistors normally are inactive or turned off. However, a latchup event, for example, resulting from the impact of a charged particle, the parasitic bipolar transistors are turned on conducting current. If such a latchup is not detected and interrupted, CMOS integrated circuits can be destroyed.

FIGS. 2A and 2B respectively illustrate a double well and a triple well CMOS bulk integrated circuit structure. In conventional CMOS logic circuits, there are bias contacts to the N well and P well in a triple well technology. These bias voltages are normally directly connected to the VDD and GND power grids in conventional CMOS circuits.

A need exists for an effective mechanism for detection and prevention of bulk complementary metal oxide semiconductor (CMOS) latchup.

SUMMARY OF THE INVENTION

Principal aspects of the present invention are to provide a method and apparatus for detection and prevention of bulk complementary metal oxide semiconductor (CMOS) latchup. Other important aspects of the present invention are to provide such method and apparatus for detection and prevention of bulk complementary metal oxide semiconductor (CMOS) latchup substantially without negative effect and that overcome many of the disadvantages of prior art arrangements.

In brief, a method and apparatus are provided for detection and prevention of bulk complementary metal oxide semiconductor (CMOS) latchup. At least one sensor is provided to monitor current flow in a bias voltage applied to at least one of an N well and a P well of the CMOS circuitry. At least one switch is coupled between either the positive voltage supply rail and the N well or the ground voltage supply rail and the P well of the CMOS circuitry. A latchup event is detected responsive to a predefined increase in the monitored current flow. The switch temporarily interrupts the connection of at least one of the N well and the P well to the respective voltage supply rail when the latchup event is detected.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
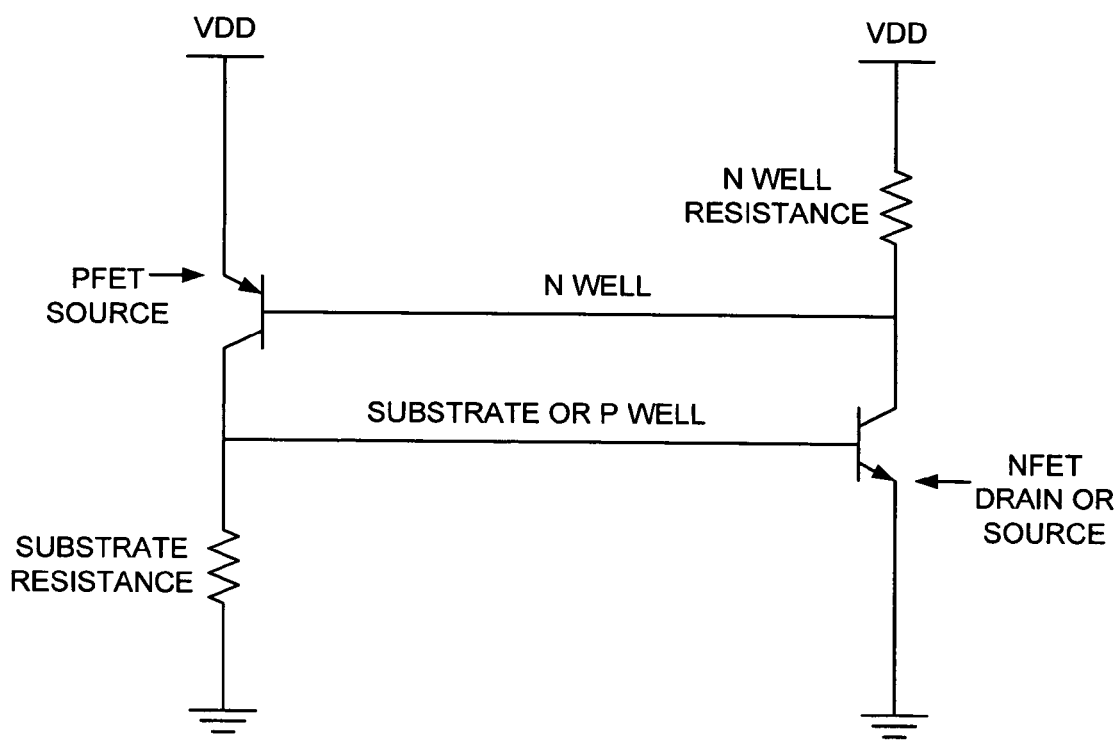
FIG. 1 is a schematic of a conventional latchup structure including parasitic bipolar transistors formed with a conventional CMOS inverter stage.
Figure 2A:
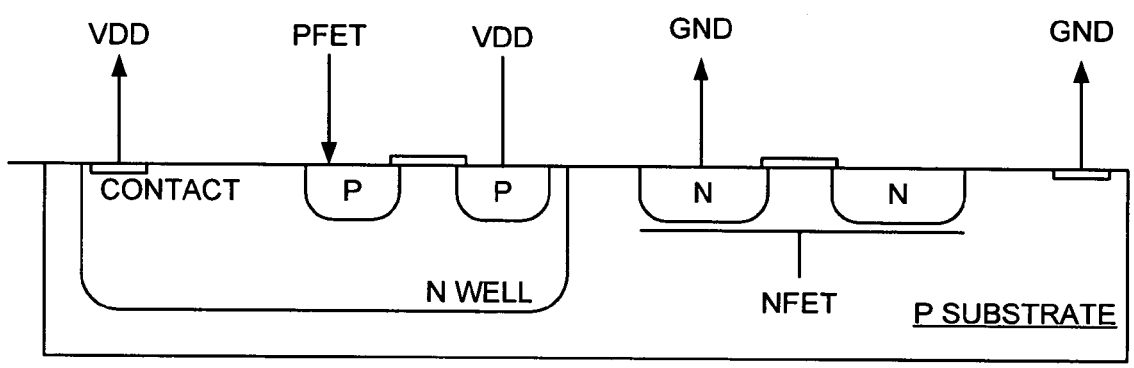
FIGS. 2A and 2B are cross sectional views respectively illustrating a double well and a triple well bulk CMOS integrated circuit structure.
Figure 2B:
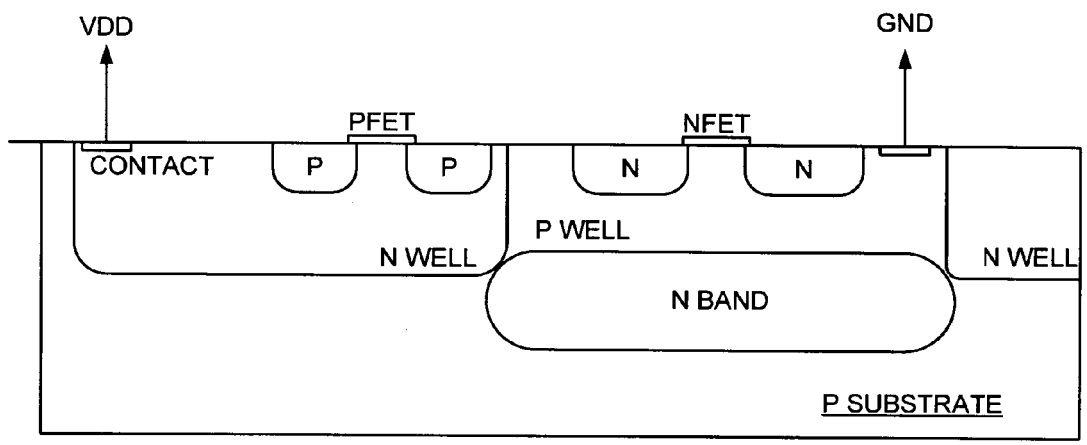
Figure 3:
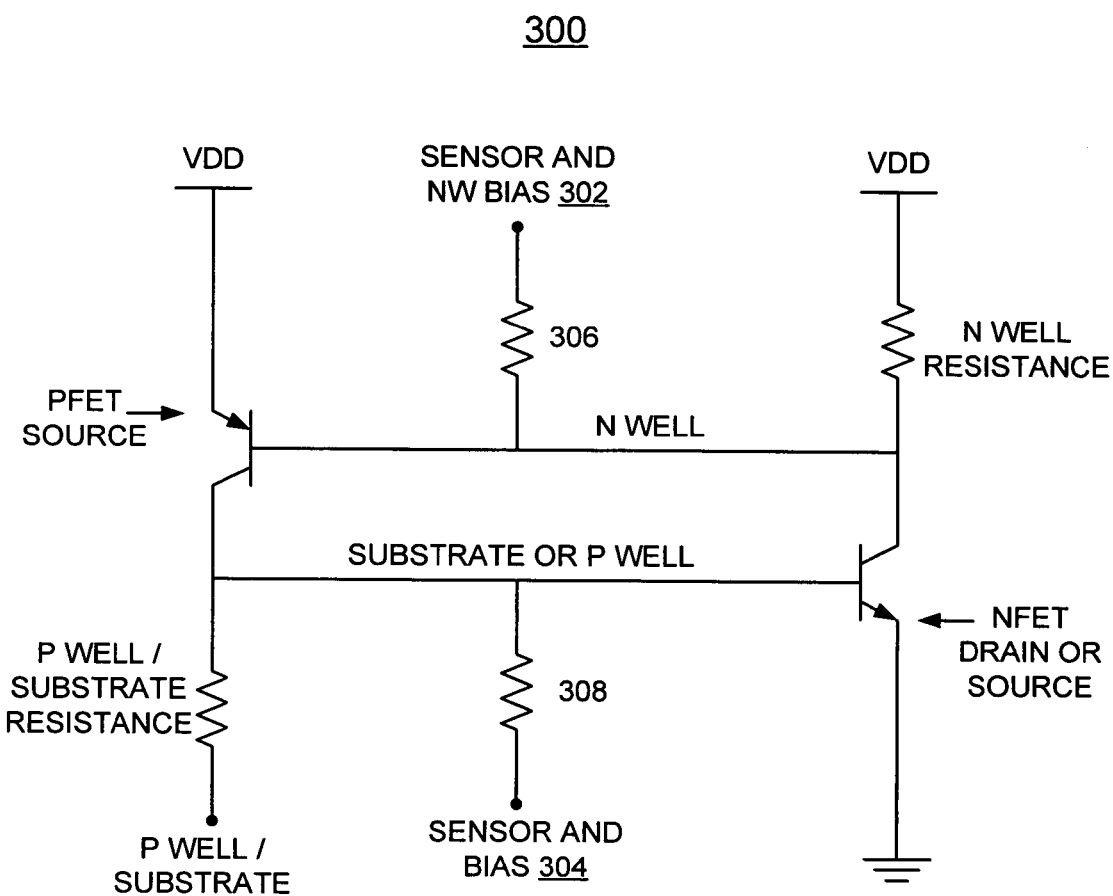
FIGS. 3 and 4 schematic diagrams illustrating exemplary apparatus for detection and prevention of bulk complementary metal oxide semiconductor (CMOS) latchup in accordance with the preferred embodiment.

Having reference now to the drawings, in FIG. 3, there is shown exemplary apparatus for detection and prevention of bulk complementary metal oxide semiconductor (CMOS) latchup generally designated by the reference character 300 in accordance with the preferred embodiment. Latchup detection and prevention apparatus 300 is shown with conventional CMOS circuit latchup structure, such as including parasitic transistors of a CMOS inverter as shown in FIG. 1.

Latchup detection and prevention apparatus 300 includes a sensor and N well bias function generally designated 302 coupled to the N well, and a sensor and P well bias function generally designated 304 coupled to the P well. The sensor and N well bias function 302 includes a sensor resistor 306 coupled to the N well and the sensor and P well bias function 304 includes a sensor resistor 308 coupled to the P well.

Figure 4:
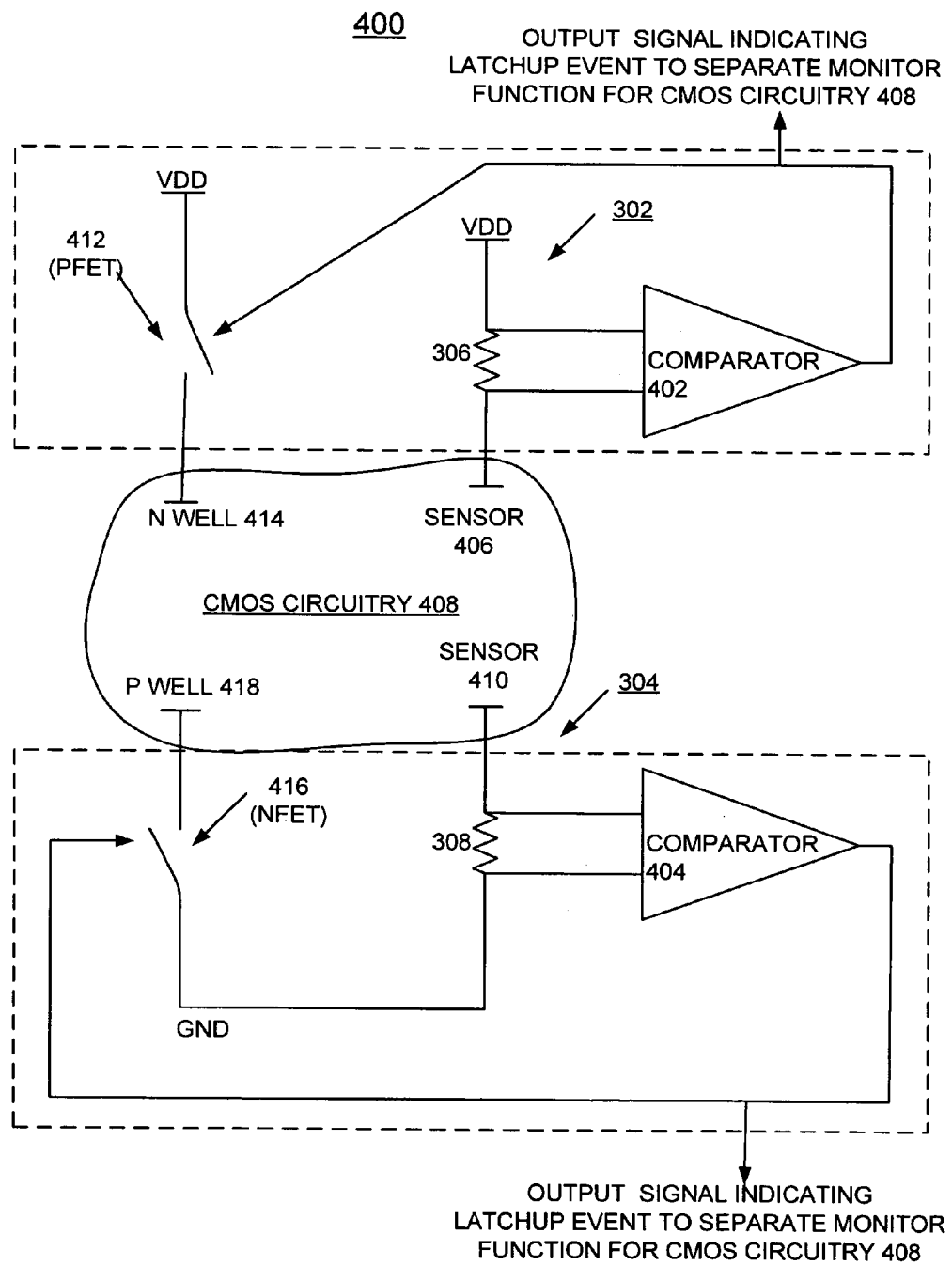

FIG. 4 further illustrates exemplary apparatus for detection and prevention of bulk complementary metal oxide semiconductor (CMOS) latchup generally designated by the reference character 400 in accordance with the preferred embodiment. Latchup detection and prevention apparatus 400 includes a comparator 402 coupled to the sensor and N well bias function 302 and a comparator 404 coupled to the sensor and N well bias function 302. The sensor and N well bias function 302 includes the sensor resistor 306 coupled between a positive voltage supply rail VDD and a sensor contact 406 connected to the N well of CMOS circuitry 408. The sensor and P well bias function 304 includes the sensor resistor 308 coupled between a ground voltage supply rail GND and a sensor contact 410 connected to the P well of CMOS circuitry 408.

In accordance with features of the invention, a separate power distribution is provided for the N well and P well. A separate power distribution grid couples a positive voltage supply rail to the N well and the CMOS circuit 408 and a ground voltage supply rail to the P well and the CMOS circuit 408. The current in the bias voltage is monitored and, for example, either limited to a level insufficient to sustain a latchup or an increase in current is detected indicating a latchup event. A switch is operated for temporarily interrupting a connection of the N well and the P well to the respective positive or ground voltage supply rail, or to interrupt the current flow responsive to a detected latchup event. This destroys the state of the protected CMOS circuit 408, but circuit operation can be restored while avoiding circuit failure from an otherwise sustained latchup event.

As shown in FIG. 4, a switch 412 is connected between the positive voltage supply rail VDD to an N well contact 414 and the CMOS circuit 408. The switch 412, such as a P-channel field effect transistor (PFET), receives a control signal from the comparator 402 for temporarily interrupting a connection of the N well and CMOS circuit 408 to the voltage supply rail VDD and current is interrupted responsive to a detected latchup event.

As shown in FIG. 4, a switch 416 is connected between the ground voltage supply rail GND to a P well contact 418 and the CMOS circuit 408. The switch 416, such as an N-channel field effect transistor (NFET), receives a control signal from the comparator 404 for temporarily interrupting a connection of the P well and CMOS circuit 408 to the ground voltage supply rail GND so that current is interrupted responsive to a detected latchup event.

It should be understood that latchup detection and prevention apparatus 400 optionally includes either one or both of the sensor and N well bias function 302 together with switch 412 and the sensor and P well bias function 304 and switch 416. For example, effective latchup detection and prevention is provided with that latchup detection and prevention apparatus 400 including only the sensor and N well bias function 302 together with switch 412.

An output signal from either or both of the comparator 402 and comparator 404 is applied to a separate monitor function for the CMOS circuitry 408. Various resets can be generated by the separate monitor function for the CMOS circuitry 408, if necessary responsive to a detected latchup event. In CMOS circuitry 408, a circuit book that is used to connect the N well and P well to VDD/GND are replaced by a generally equivalent book, except which includes pins wired to separate power distribution to connect the N well and P well to VDD and GND supply voltage rails via either one or both of switches 412, 416. These separate power distributions are momentarily interrupted or the VDD and/or GND supply voltage rails are disconnected from the N well and P well and the outside monitor is signaled responsive a detected increase in current or drop in voltage indicating a latchup event.

Figure 5:
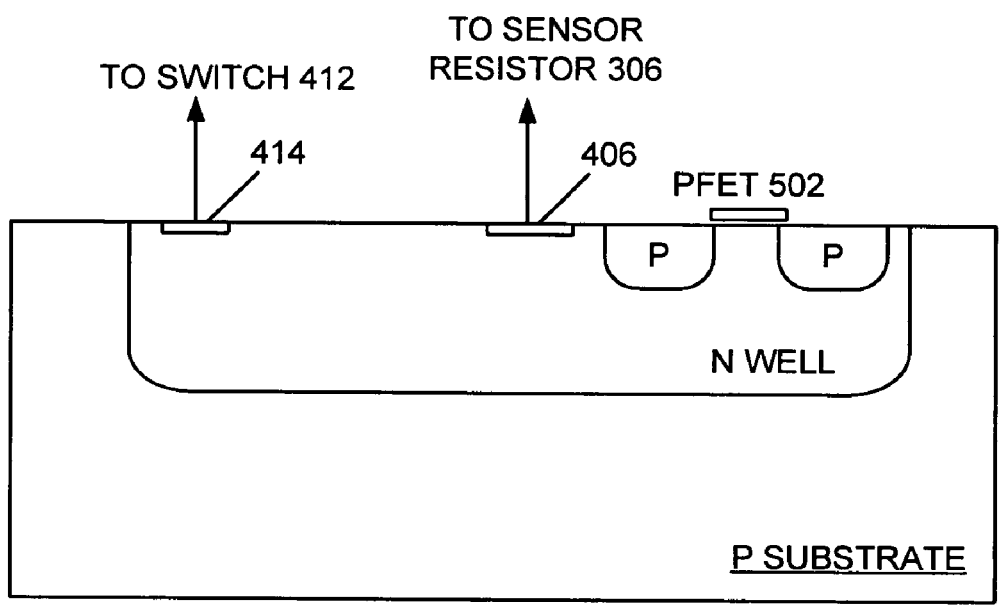
FIG. 5 is a cross sectional view illustrating a bulk CMOS integrated circuit structure including an exemplary sensor and separate N well bias contacts in accordance with the preferred embodiment.

FIG. 5 illustrates exemplary bulk CMOS integrated circuit structure generally designated by the reference character 500 in accordance with the preferred embodiment. CMOS integrated circuit structure 500 includes the exemplary sensor contact 406 for connection to the sensor and N well bias function 302 and a separate N well bias contact 414 for connection to the switch 412 in accordance with the preferred embodiment. As shown, CMOS integrated circuit structure 500 includes a PFET 502 formed in the N well.

While the present invention has been described with reference to the details of the embodiments of the invention shown in the drawing, these details are not intended to limit the scope of the invention as claimed in the appended claims.

What is claimed is:

1. Apparatus for detection and prevention of bulk CMOS latchup comprising:

at least one sensor for monitoring current flow in a bias voltage applied to at least one of an N well and a P well of the CMOS circuitry; a latchup event being detected responsive to a predefined increase in the monitored current flow;

at least one switch being coupled between a respective voltage supply rail and at least one of the N well and the P well of the CMOS circuitry and the CMOS circuitry voltage supply rail;

a switch control coupled between said at least one sensor and said at least one switch for temporarily interrupting a connection of at least one of the N well and the P well and the CMOS circuitry voltage supply rail to voltage supply rail responsive to the latchup event being detected.

2. Apparatus for detection and prevention of bulk CMOS latchup as recited in claim 1 wherein said at least one sensor includes a sensor contact connected to the N well, a resistor coupled between said sensor contract and a positive voltage supply rail.

3. Apparatus for detection and prevention of bulk CMOS latchup as recited in claim 1 wherein said at least one sensor includes a sensor contact connected to the P well, a resistor coupled between said sensor contract and a ground voltage supply rail.

4. Apparatus for detection and prevention of bulk CMOS latchup as recited in claim 1 wherein said at least one switch includes a field effect transistor.

5. Apparatus for detection and prevention of bulk CMOS latchup as recited in claim 1 wherein said switch control includes a comparator.

6. Apparatus for detection and prevention of bulk CMOS latchup as recited in claim 1 wherein said switch control provides an output control signal responsive to the latchup event being detected.

* * * * *